United States Patent
Chen

(10) Patent No.: US 10,424,386 B2
(45) Date of Patent: Sep. 24, 2019

(54) ERASING METHOD FOR FLASH MEMORY USING A MEMORY MANAGEMENT APPARATUS

(71) Applicant: ELITE SEMICONDUCTOR MEMORY TECHNOLOGY INC., Hsinchu (TW)

(72) Inventor: Chih-Hao Chen, New Taipei (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 15/902,325

(22) Filed: Feb. 22, 2018

(65) Prior Publication Data
US 2019/0259461 A1  Aug. 22, 2019

(51) Int. Cl.
*G11C 16/34* (2006.01)
*G11C 11/56* (2006.01)
*G11C 16/14* (2006.01)

(52) U.S. Cl.
CPC ........ *G11C 16/344* (2013.01); *G11C 11/5635* (2013.01); *G11C 16/14* (2013.01); *G11C 16/3404* (2013.01)

(58) Field of Classification Search
CPC .............. G11C 16/344; G11C 16/3404; G11C 11/5635; G11C 16/14; G11C 11/5621
See application file for complete search history.

(56) References Cited

U.S. PATENT DOCUMENTS

| | | | |
|---|---|---|---|
| 8,971,125 B2* | 3/2015 | He | G11C 11/5635 365/185.22 |
| 2010/0142269 A1* | 6/2010 | Kikuchi | G11C 11/5621 365/185.03 |

* cited by examiner

*Primary Examiner* — David Lam
(74) *Attorney, Agent, or Firm* — Juan Carlos A. Marquez; Marquez IP Law Office, PLLC

(57) ABSTRACT

An erasing method used in a flash memory comprising at least one memory block divided into a plurality of memory sectors is illustrated. Whether the memory block or the memory sector corresponding to an address has at least one under-erased transistor memory cell according to a sector enable signal is verified, wherein the sector enable signal is determined according to whether the memory block has at least one over-erased transistor memory cell. The transistor memory cells of the memory block or the memory sector will be erased according to the sector enable signal if the memory block or the memory sector corresponding to the address that has the under-erased transistor memory cell.

12 Claims, 4 Drawing Sheets

ERASING METHOD FOR FLASH MEMORY USING A MEMORY MANAGEMENT APPARATUS

TECHNICAL FIELD

The present disclosure relates to a flash memory, and in particular to an erasing method used in a flash memory.

RELATED ART

A flash memory includes individual Metal-Oxide-Semiconductor (MOS) field effect transistor memory cells, each of which includes a source, a drain, a floating gate and a control gate to which various voltages are applied to program the transistor memory cell with a binary 1 or 0, to erase all of the transistor memory cells as a memory block, to read the transistor memory cell, to verify that the transistor memory cell is erased or to verify that the transistor memory cell is not over-erased.

The undesirable effect of the leakage current from the over-erased transistor memory cells is described as follows. In a typical flash memory, the drains of a large number of transistor memory cells, for example 512 transistor memory cells are connected to each bit line. If a substantial number of transistor memory cells on the bit line are drawing background leakage current, the total leakage current on the bit line may exceed the cell read current. This makes it impossible to read the state of any transistor memory cell on the bit line and therefore renders the flash memory inoperative.

Referring to FIG. 1, FIG. 1 is a flow chart of a conventional erasing method. A flash memory comprises a memory module and a memory management apparatus electrically connected to the memory module, wherein the memory module has multiple memory banks, each of the memory bank comprises multiple memory blocks, and the memory management apparatus is used to perform the erasing method of the memory block of the memory bank.

At step S11, the memory management apparatus verifies and pre-programs all transistor memory cells of the memory module. Next, at step S12, the memory management apparatus verifies and erases all of the transistor memory cells as a memory block, and that is, the erasing unit is one memory block. Finally, to prevent the leakage current of the over-erased transistor memory cell from rendering the flash memory inoperative, at step S13, the memory management apparatus verifies all transistor memory cells of the memory module and performs over-erased correction on the over-erased transistor memory cell(s) of the memory module while the verification result shows at least one over-erased transistor memory cell exists in the memory block.

Specifically, step S12 comprises steps S121 through S124. At step S121, the memory management apparatus verifies the transistor memory cell of the memory block corresponding to an address. Then, at step S122, if a verification result shows at least one transistor memory cell in the memory block is under-erased (i.e. the verification result shows the erasing verification fail of the memory block), the memory management apparatus will execute step S124; otherwise, the memory management apparatus will execute step S123.

Next, since at least one memory cell in the memory block is under-erased, the memory management apparatus injects an erasing shot to the transistor memory cells of the memory block (i.e. erases the transistor memory cells of the memory block) at step S124, so as to change threshold voltages of the transistor memory cells in the memory block (i.e. to make the transistor memory cells in the memory block be erased). Next, step S121 is executed again. Then, if all of the transistor memory cells in the memory block being erased is determined at step S122, step S123 will be executed. At step S123, the memory management apparatus checks whether the address is a maximum address (i.e. whether the transistor memory cells of all memory blocks are erased). If the address is not, a maximum address, step S125 will be executed; otherwise, step S13 will be executed. At step S125, the memory management apparatus increments the address to the next consecutive address, and then step S121 is executed.

It is noted that when the bit line of the slower erased transistor memory cell has a large bit line leakage current, the erased threshold voltage will become higher after the bit line leakage current is recovered at step S13. Meanwhile, more over-erased transistor memory cells will suffer long over-erased correction times.

Rather than verifying and erasing all the transistor memory cells in the memory block as mentioned above, for each memory block, another conventional erasing method can merely erase the transistor memory cells in the memory sector(s) which has the under-erased transistor memory cells. Referring to FIG. 2, FIG. 2 is a schematic diagram showing another conventional erasing method performed on a memory block. The memory block 2 is divided into several memory sectors G1 through G15, and several flag registers are used for the memory sectors G1 through G15 respectively, so as to record whether all the transistor memory cells in the memory sectors G1 through G15 are erased.

As shown in FIG. 2, all memory sectors G1 through G15 initially have the under-erased transistor memory cells, and thus the erasing shot is injected to the transistor memory cells of the memory sectors G1 through G15 (i.e. erasing the transistor memory cells of the memory block 2). Then, all of the transistor memory cells of the memory block 2 are verified, namely the memory sector G3 has no under-erased transistor memory cells for example, and the flag register corresponding to the memory sector G3 records its status as an erased status. Hence, the erasing shot is injected to the transistor memory cells of the memory sectors G1, G2, G4 through G15 (i.e., erasing the transistor memory cells of the memory sectors G1, G2, G4 through G15).

Next, all of the transistor memory cells of the memory block 2 are verified again, the memory sectors G1, G3, G4 through G15 have no under-erased transistor memory cells, and the flag, registers corresponding, to the memory sector G1, G3, G4 through G15 record their statuses as being erased. Hence, the erasing shot is injected to the transistor memory cells of the memory sector G2 (i.e., erasing the transistor memory cells of the memory sector G2). This conventional erasing method needs a plurality of additional flag registers and adds a substantial amount, of erasing verification time.

SUMMARY

One objective of the present disclosure is to provide an erasing method used in a flash memory which does not additionally need a plurality of flag registers, and also does not add substantial erasing verification time.

Another objective, of the present disclosure is to provide a flash memory which executes the above erasing method.

To achieve at least the above objective, the present disclosure provides an erasing method used in a flash memory comprising at least one memory block divided into a plurality of memory sectors. The erasing method is illustrated as follows. Whether the memory block or the memory sector corresponding to an address has at least one under-erased transistor memory cell according to a sector enable signal is verified, wherein the sector enable signal is determined according to whether the memory block has at least one over-erased transistor memory cell. The transistor memory cells of the memory block or the memory sector will be erased according to the sector enable signal if the memory block or the memory sector corresponding to the address has the under-erased transistor memory cell.

To achieve at east the above objective, the present disclosure provides a flash memory comprising a memory module and a memory management apparatus. The memory module comprises at least one memory block divided into a plurality of memory sectors. The memory management apparatus is electrically connected to the memory module. The memory management apparatus verifies whether the memory block or the memory sector corresponding to an address has at least one under-erased transistor memory cell according to a sector enable signal, wherein the sector enable signal is determined according to whether the memory block has at least one over-erased transistor memory cell. The memory management apparatus erases transistor memory cells of the memory block or the memory sector according to the sector enable signal if the memory block or the memory sector corresponding to the address has the under-erased transistor memory cell.

In one embodiment of the present disclosure, if the sector enable signal is asserted, no and the memory sector corresponding to the address has the under-erased transistor memory cell, the transistor memory cells of the memory sector will be injected with an erasing shot at least one time until the memory sector does not have the under-erased transistor memory cell.

In a further embodiment of the present disclosure, the address will be incremented if the memory sector does not have the under-erased transistor memory cell, and then if another one the memory sector corresponding to the address has at least one under-erased transistor memory cell, transistor memory cells of the other one memory sector will be injected with the erasing shot at least one time until the other one memory sector does not have the under-erased transistor memory cell.

In an even further embodiment of the present disclosure, when the address reaches a maximum address, whether the memory block has the over-erased transistor memory cell is verified, and over-erased correction will be performed on the over-erased transistor memory cell if there is the over-erased cell in the memory block.

In another embodiment of the present disclosure, the transistor memory cells of the memory block are verified and pre-programmed before verifying and erasing the transistor memory cells of the memory block.

In another embodiment of the present disclosure, the sector enable signal is initially de-asserted, if the memory block corresponding to the address has the under-erased transistor memory cell, the transistor memory cells of the memory block will be injected with an erasing shot at least one time until the memory block is verified to have the over-erased transistor memory cell.

In yet another embodiment of the present disclosure, when the memory block is verified to have the over-erased transistor memory cell, an over-erased correction shot is injected to the over-erased transistor memory cells, and the sector enable signal is set to be asserted.

To sum up, the erasing method does not need additional flag registers for recording statuses of the memory sectors, nor cost much erasing verification time.

DETAILED DESCRIPTION OF THE PREFERRED EMBODIMENTS

To make it easier for the examiner to understand the objects, characteristics and effects of this present disclosure, embodiments together with the attached drawings for the detailed description of the present disclosure are provided.

One embodiment of the present disclosure provides an erasing method used in a flash memory (see FIG. 4) wherein, at the verification and erasing step, the provided erasing method verifies whether the memory block has at least one over-erased transistor memory cell after an erasing shot is injected to all the transistor memory cells of the memory block (i.e. erasing all the transistor memory cells of the memory block). The provided erasing method injects the erasing shot to the transistor memory cells of the memory sector (i.e., erasing all the transistor memory cells of the memory sector) while the memory block has at least one over-erased transistor memory cell, and then the provided erasing method verifies whether all the transistor memory cells of the memory sector are erased. The provided erasing method erases the transistor memory cells of the memory sector at least one time until the transistor memory cells of the memory sector are erased. Next, the provided erasing method erases the memory sector of another one memory sector in the same memory block at least one time until the transistor memory cells of the other one memory sector are erased. When the transistor memory cells all of the memory sectors in the memory block are erased, the similar erasing scheme is performed on another memory block. Accordingly, the provided erasing method does not need additional flag registers for recording the statuses of the memory sectors, and does not cost much erasing verification time.

Figure 3:
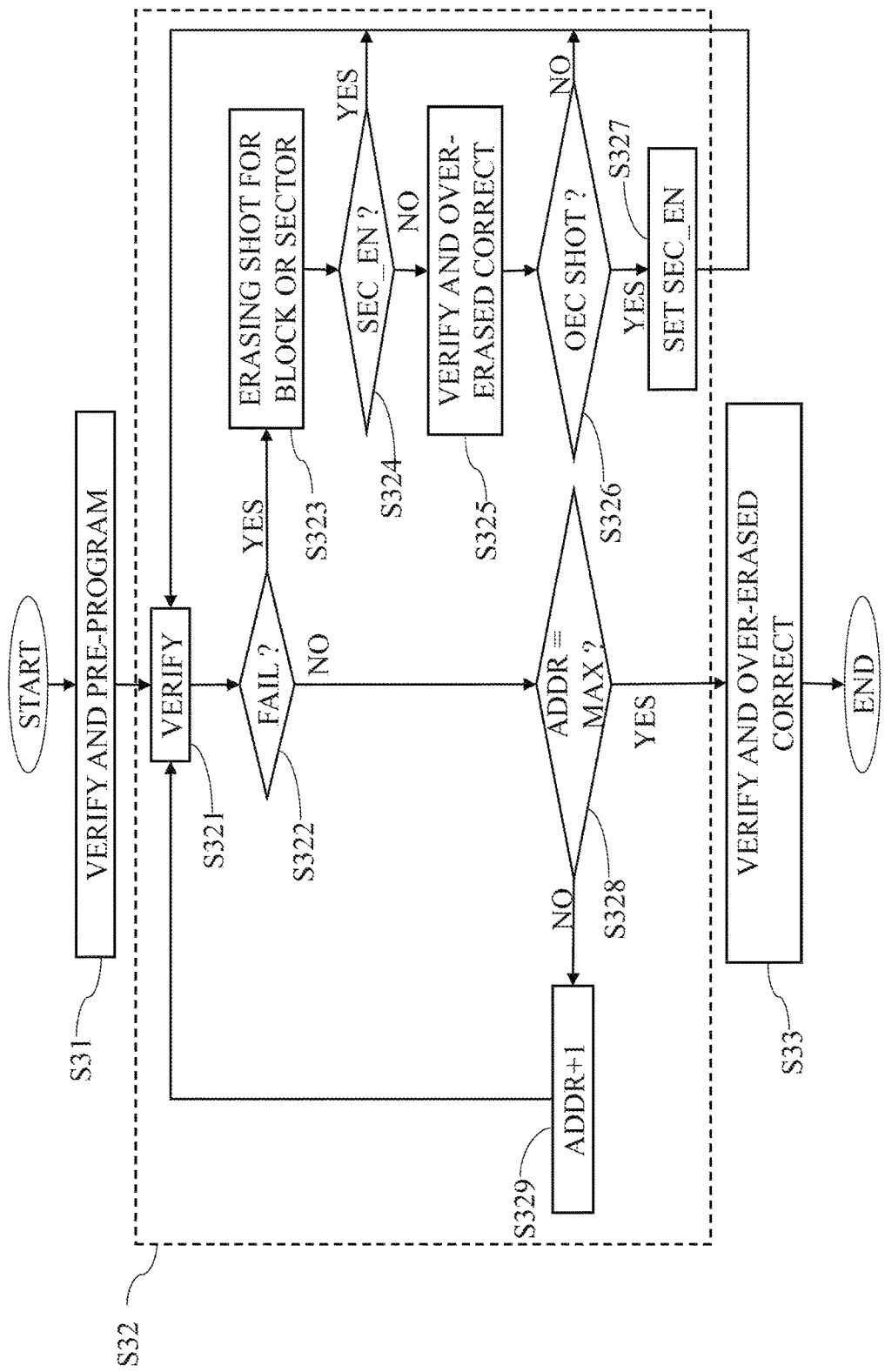
FIG. 3 is a flow chart of an erasing method used in a flash memory according to one embodiment of the present disclosure.
Figure 4:
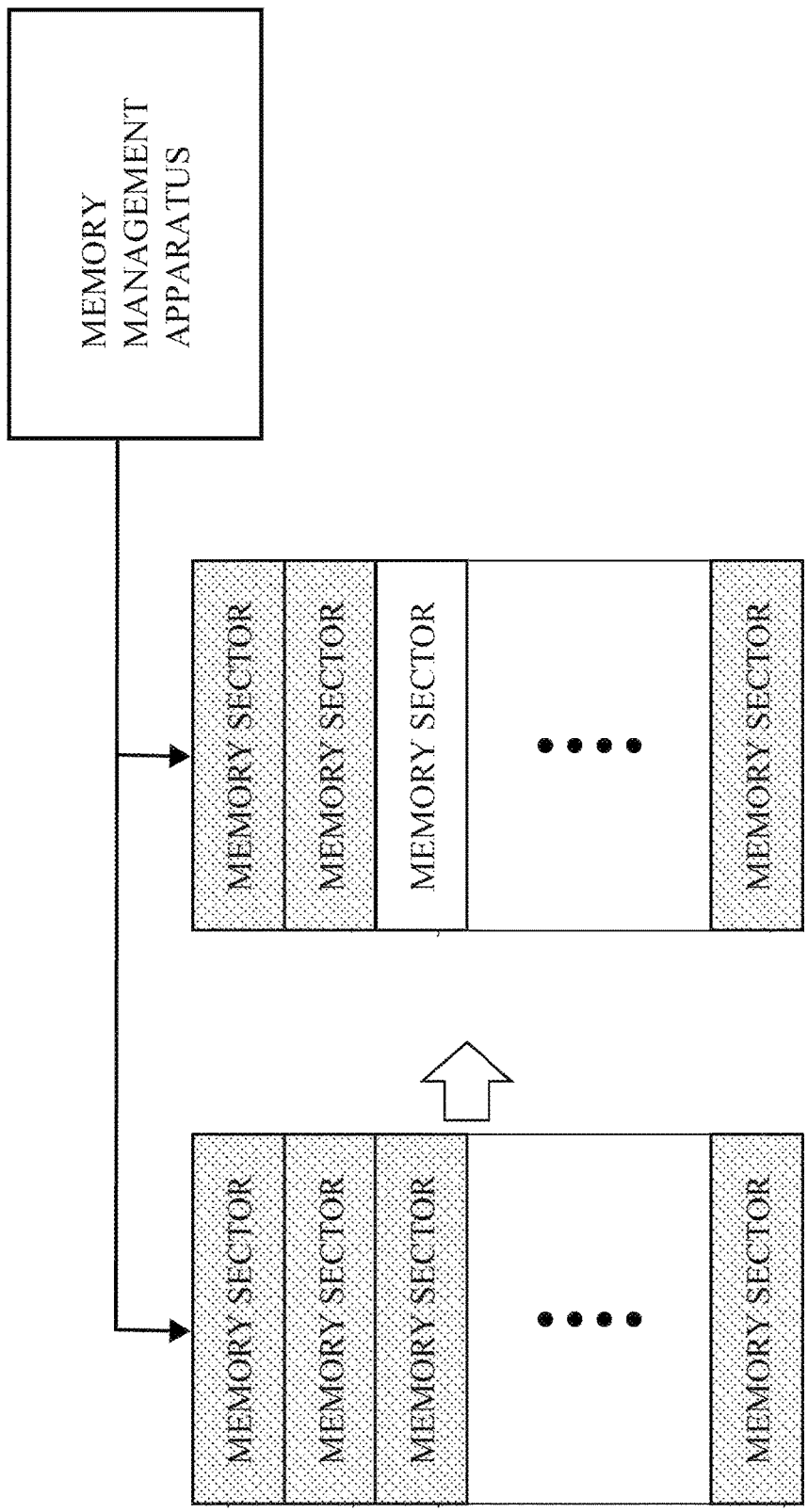
FIG. 4 is a schematic diagram of one embodiment of a flash memory in which the erasing method is performed on a memory block according to the present invention.

Referring to FIG. 3, FIG. 3 is a flow chart of an erasing method used in a flash memory according to one embodiment of the present disclosure. The flash memory as shown in FIG. 4 comprises a memory module and a memory management apparatus electrically connected to the memory module, wherein the memory module comprises a plurality of memory banks, each memory bank comprises a plurality of memory blocks, and each memory block is divided into a plurality of memory sectors. For example, the memory block has 64 Kbytes (i.e., 64*8 Kbits), and the memory sector has 4 Kbytes (i.e., 4*8 Kbits), However, the present disclosure is not limited thereto.

At step S31, the memory management apparatus verifies and pre-programs transistor memory cells of the memory module. Then, at step S32 (i.e., erasing, and verification step), the memory management apparatus verifies and erases the transistor memory cells of the memory module. It is noted that, at step S32, the provided erasing method can erase the transistor memory cells of the memory block or the memory sector based upon whether the over-erased correction shot is injected to the transistor memory cell(s) of the memory block (i.e., whether the memory block has at least one aver-erased transistor memory cell). Finally, to prevent the leakage current of the over-erased transistor memory cell from rendering the flash memory inoperative, at step S33, the memory management apparatus verifies all transistor memory cells of the memory module and performs over-erased correction on the over-erased transistor memory cell(s) of the memory module.

Specifically, step S32 comprises steps S321 through S329. At step S321, the memory management apparatus verifies whether the transistor memory cells, of the memory block or the memory sector corresponding to an address are erased to generate a verification result. When a sector enable signal SEC_EN corresponding to the memory block is asserted, the transistor memory cells of the memory sector is verified; and when the sector enable signal SEC_EN corresponding to the memory block is de-asserted, the transistor memory cells of the memory block is verified, wherein the sector enable signal SEC_EN corresponding to the memory block is determined according to whether the memory block has at least one over-erased transistor memory cell. If the memory block or sector has at least one under-erased transistor memory cell, the memory management apparatus will determine the verification result is failed; and if the memory block or the memory sector does not have at least one under-erased transistor memory cell, the memory management apparatus will determine that the verification result is passed.

At step S322, the memory management apparatus checks whether the verification result is failed or passed. If the verification result is failed, step S323 will be executed; otherwise, step S328 will be executed. At step S323, the memory management apparatus injects the erasing shot into transistor memory cells of the memory block or the memory sector according to the sector enable signal SEC_EN corresponding to the memory block. If the sector enable signal SEC_EN corresponding to the memory block is asserted, the memory management apparatus will inject the erasing shot into transistor memory cells of the memory block. Otherwise, the memory management apparatus will inject the erasing shot into transistor memory cells of the memory sector.

At step S324, the memory management apparatus checks whether the sector enable signal SEC_EN corresponding to the memory block is asserted. If the sector enable signal SEC_EN corresponding to the memory block is asserted, step S321 will be executed; otherwise, step S325 will be executed. At step S325, the memory management apparatus verifies whether the memory block has at least one over-erased transistor memory cell, and performs over-erased correction on the transistor memory cell(s) of the memory block while the memory block has at least one over-erased transistor memory cell.

Next, at step S326, the memory management apparatus checks whether the over-erased correction is performed (i.e., whether the memory block has at least one over-erased transistor memory cell, or whether an over-erased correction (OEC) shot is injected to the over-erased transistor memory cell(s) of the memory block). If the over-erased correction is performed, step S327 will be executed; otherwise, step S321 will be executed. At step S327, the memory management apparatus set the sector enable signal SEC_EN corresponding to the memory block to be asserted. At step S328, the memory management apparatus checks whether the address is the maximum address. At step S329, the memory management apparatus increments the address to the next memory sector, wherein the increment corresponds to the size of the memory sector.

Initially, the sector enable signal SEC_EN corresponding to the memory block is de-asserted, when the provided erasing method firstly erases the transistor memory cells of the memory block. For example, when the transistor memory cells of the memory block are verified, at step S321 firstly, and if there are under-erased transistor memory cell in the memory block, the erasing shot is injected to the transistor memory cells of the memory block at step S323. Next, since the sector enable signal SEC_EN corresponding to the memory block is de-asserted, whether the memory block has at least one over-erased transistor memory cell is check at step S325. Generally, after the provided erasing method erases the transistor memory cells of the memory block several times or once, there are over-erased transistor memory cell in the memory block, and thus at step S327, the sector enable signal SEC_EN corresponding to the memory block is set to be asserted.

Next, the transistor memory cells of the memory sector corresponding to the address are verified at step S321 and injected with the erasing shot at S323 until the transistor memory cells of memory sector are erased. If the transistor memory cells of the memory sector corresponding to the address are erased, the address will be added with an increment at S329, and the transistor memory cells of another one memory sector corresponding to the address in the same memory block is verified at step S321 and injected with the erasing shot at step S323 until the transistor memory cells of other one memory sector are erased. Hence, the transistor memory cells of all the memory sectors in the memory block are erased, and the provided erasing method will perform the similar erasing scheme on the next memory block.

Figure 1:
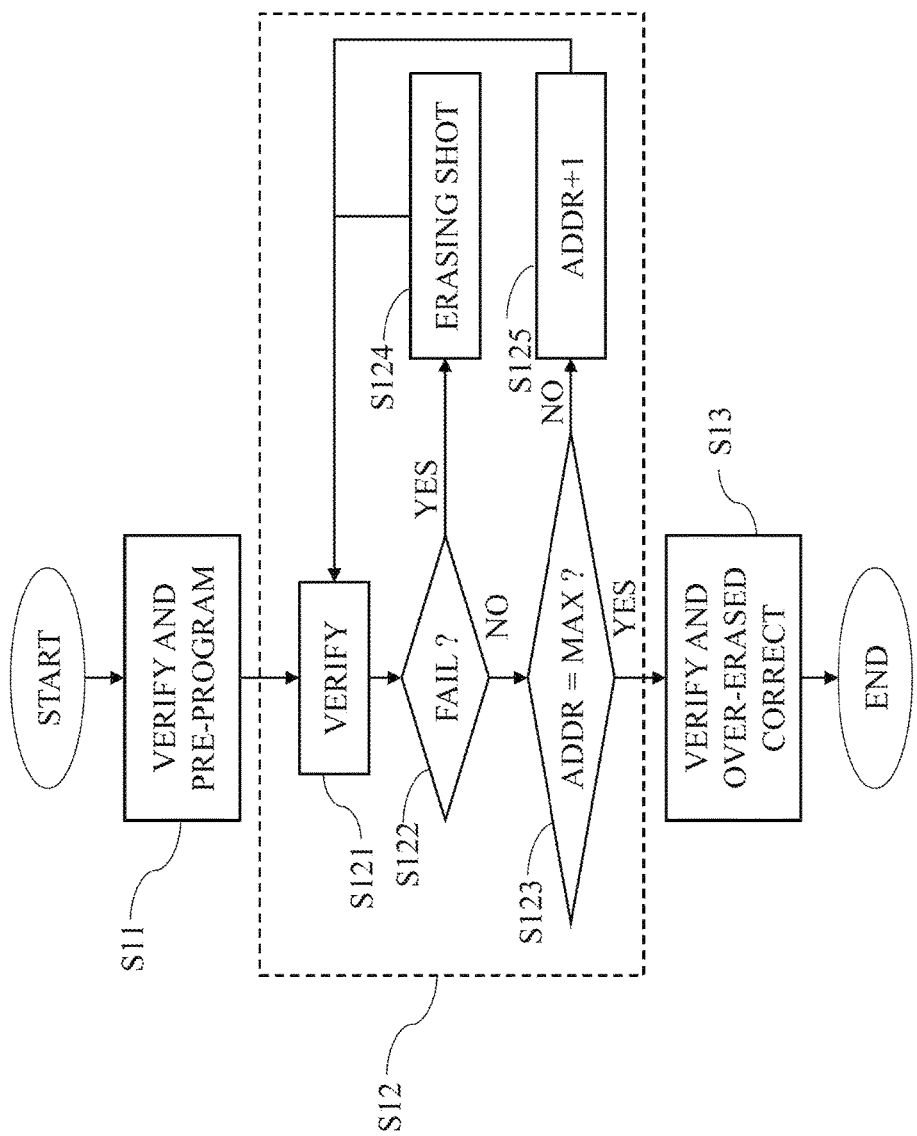
FIG. 1 is a flow chart of a conventional erasing, method.
Figure 2:
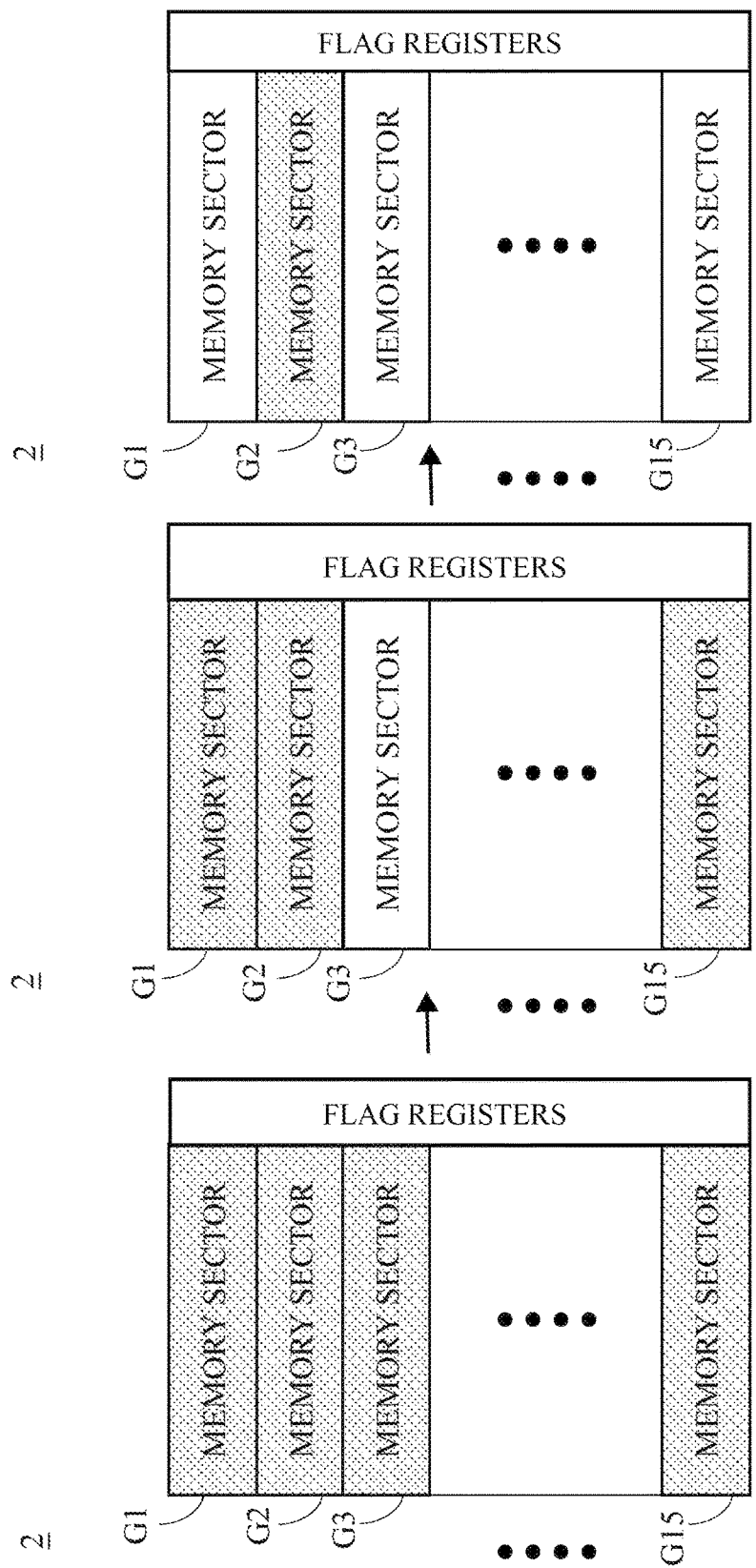
FIG. 2 is a schematic diagram showing another conventional erasing method performed on a memory block.

In conclusion, at the verification and erasing step, the provided erasing method used in the flash memory according to one embodiment of the present invention erases the transistor memory cells of the memory sector or the memory block according to whether the memory block has at least one over-erased transistor memory cell, such that the erasing method does not need additional flag registers for recording statuses of the memory sectors. Furthermore, whereas the conventional method in FIG. 2 injects an erasing shot to erase and verify the whole memory block (p.s. the unit for verification is 8 bits or more bits), the erasing method of the present invention injects an erasing shot to perform the OEC verification on the bit lines of the whole memory block (e.g., the unit for verification is 8 bits or more bits), such that the erasing method of the present disclosure can save much time. Moreover, the slower and faster erased transistor memory cells in the memory sectors have a low probability of connecting to the same bit line, and the erasing method of the present disclosure obtains a small erased threshold voltage distribution as compared to that obtained by the conventional method of FIG. 2, such that the problem of the over-erased transistor memory cells masking the under-erased transistor memory cells can be avoided, and the over-erased transistor memory cells will not suffer long over-erased correction times and post-over-erased correction times.

While the present invention has been described by means of specific embodiments, numerous modifications and variations could be made thereto by those skilled in the art without departing from the scope and spirit of the present invention set forth in the claims.

What is claimed is:

1. An erasing method used in a flash memory comprising at least one memory block divided into a plurality of memory sectors, comprising:

verifying whether the memory block or the memory sector corresponding to an address has at least one under-erased transistor memory cell according to a sector enable signal, wherein the sector enable signal is determined according to whether the memory block has at least one over-erased transistor memory cell; and erasing transistor memory cells of the memory block or the memory sector according to the sector enable signal if the memory block or the memory sector corresponding to the address has the under-erased transistor memory cell, wherein if the sector enable signal is asserted, and the memory sector corresponding to the address has the under-erased transistor memory cell, the transistor memory cells of the memory sector are injected with an erasing shot at least one time until the memory sector does not have the under-erased transistor memory cell.

2. The erasing method according to claim 1, wherein the address is incremented if the memory sector does not have the under-erased transistor memory cell, and then if another memory sector corresponding to the address has at least one under-erased transistor memory cell, transistor memory cells of the other memory sector will be injected with the erasing shot at least one time until the other memory sector does not have the under-erased transistor memory cell.

3. The erasing method according to claim 2, further comprising:

when the address reaches a maximum address, verifying whether the memory block has the over-erased transistor memory cell and performing over-erased correction on the over-erased transistor memory cell if there is the over-erased cell in the memory block.

4. The erasing method according to claim 1, further comprising:

verifying and pre-programming the transistor memory cells of the memory block before verifying and erasing the transistor memory cells of the memory block.

5. The erasing method according to claim 1, wherein when the sector enable signal is initially de-asserted, if the memory block corresponding to the address has the under-erased transistor memory cell, the transistor memory cells of the memory block are injected with an erasing shot at least one time until the memory block is verified to have the over-erased transistor memory cell.

6. The erasing method according to claim 5, wherein when the memory block is verified to have the over-erased transistor memory cell, an over-erased correction shot is injected to the over-erased transistor memory cells, and the sector enable signal is set to be asserted.

7. A flash memory, comprising:

a memory module, comprising at least one memory block divided into a plurality of memory sectors;

a memory management apparatus, electrically connected to the at least one memory module;

wherein the memory management apparatus verifies whether the memory block or the memory sector corresponding to an address has at least one under-erased transistor memory cell according to a sector enable signal, wherein the sector enable signal is determined according to whether the memory block has at least one over-erased transistor memory cell; and the memory management apparatus erases transistor memory cells of the memory block or the memory sector according to the sector enable signal if the memory block or the memory sector corresponding to the address has the under-erased transistor memory cell, wherein if the sector enable signal is asserted, and the memory sector corresponding to the address has the under-erased transistor memory cell, the transistor memory cells of the memory sector are injected with an erasing shot at least one time by the memory management apparatus until the memory sector does not have the under-erased transistor memory cell.

8. The flash memory according to claim 7, wherein the address is incremented if the memory sector does not have the under-erased transistor memory cell, and then if another memory sector corresponding to the incremented address has at least one under-erased transistor memory cell, transistor memory cells of the other memory sector are injected with the erasing shot at least one time by the memory management apparatus until the other memory sector does not have the under-erased transistor memory cell.

9. The flash memory according to claim 8, wherein when the address reaches a maximum address, the memory management apparatus verifies whether the memory block has the over-erased transistor memory cell and performs over-erased correction on the over-erased transistor memory cell if there is the over-erased cell in the memory block.

10. The flash memory according to claim 7, wherein the memory management apparatus further verifies and pre-programs the transistor memory cells of the memory block before verifying and erasing the transistor memory cells of the memory block.

11. The flash memory according to claim 7, wherein when the sector enable signal is initially de-asserted, if the memory block corresponding to the address has the under-erased transistor memory cell, the transistor memory cells of the memory block are injected with an erasing shot at least one time by the memory management apparatus until the memory block is verified to have the over-erased transistor memory cell.

12. The flash memory according to claim 11, wherein when the memory block is verified to have the over-erased transistor memory cell, an over-erased correction shot is injected to the over-erased transistor memory cells, and the sector enable signal is set to be asserted.

* * * * *